United States Patent [19]

Norman

[11] Patent Number: 5,051,876
[45] Date of Patent: Sep. 24, 1991

[54] COMPOUND HAND TOOL WITH A SCREWDRIVER

[76] Inventor: Keith Norman, 2220 Pierce St., Flint, Mich. 48503

[21] Appl. No.: 565,618

[22] Filed: Aug. 9, 1990

[51] Int. Cl.$^5$ .................. F21V 33/00; B25B 23/18
[52] U.S. Cl. .................................. 362/120; 7/165; 324/506
[58] Field of Search .............. 7/165, 170; 362/119, 362/120; 324/506, 507

[56] References Cited

U.S. PATENT DOCUMENTS

| | | | |
|---|---|---|---|
| 988,192 | 3/1911 | Hetherington | 362/120 |
| 1,603,985 | 10/1926 | Rosenberg | 7/165 |
| 2,687,509 | 8/1954 | Lewis | 324/507 |
| 3,753,090 | 8/1973 | Tomek | 324/506 |
| 3,775,677 | 11/1973 | Garrett et al. | 324/506 |
| 3,873,915 | 3/1975 | Hayes | 324/506 |
| 4,250,446 | 2/1981 | Ponte | 324/506 |
| 4,768,137 | 8/1988 | Hwaw et al. | 362/120 |

Primary Examiner—Roscoe V. Parker

[57] ABSTRACT

A compound hand tool which can be attached to or include a flashlight in order to provide a single tool which performs the combined functions of a flashlight, an electrical continuity tester, a light to illuminate the work, and either a screwdriver, an awl, a nutdriver, or a socket holder. The tool eliminates the need to carry a number of separate hand tools and makes it easier to hold the required tools while performing a task such as troubleshooting an electrical panel in the dark or changing fuses under the dashboard of an automobile.

4 Claims, 9 Drawing Sheets

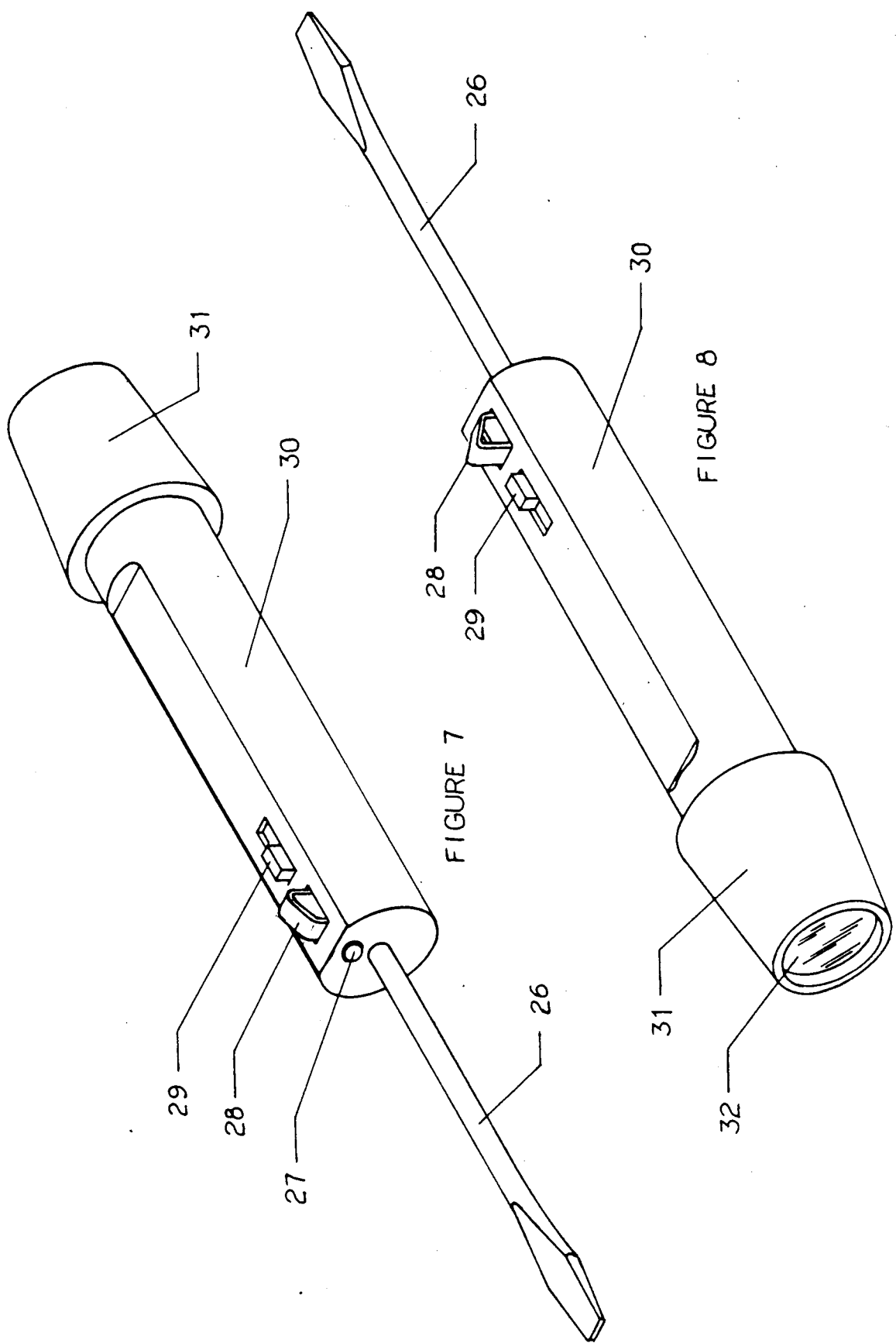

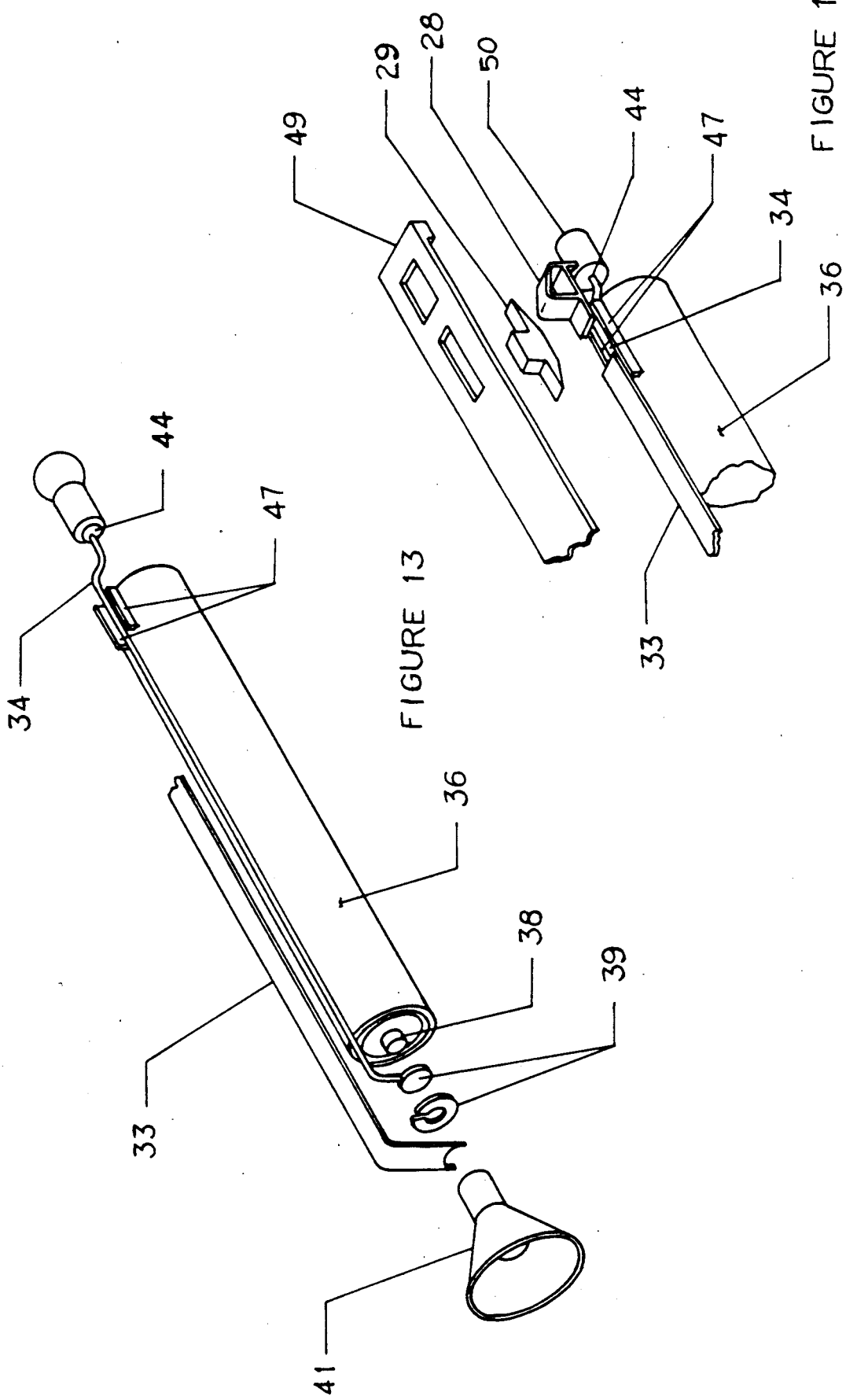

COMPOUND HAND TOOL WITH A SCREWDRIVER

BACKGROUND OF THE INVENTION

1. Field of the Invention

This invention relates in general to a compound hand tool. It relates in particular to a compound hand tool which contains the combination of a flashlight, a screwdriver, a light to illuminate the screwdriver's work, and a circuit continuity tester.

2. Summary of the Art

Tradesmen, technicians, maintenance workers, construction workers, and mechanics must carry a multiplicity of tools to troubleshoot common problems. Take the troubleshooting of an electrical fuse panel in the dark as an example:

(a) a small, battery-operated, portable light is needed to find the panel;
(b) a screwdriver is needed to unscrew the cover and pry out the fuses;
(c) a small, battery-operated, portable light is needed to illumininate the screws and the fuses while they are being worked on;
(d) a continuity tester is required to check the fuses or the circuits; and
(e) a small, battery-operated, portable light is required to illuminate the box while making any necessary repairs within or around it.

The same is true for shrouded terminal boxes which are located in hard-to-reach or out-of-the-way locations such as high up on poles, masts or antennas, under machinery, or under the hood or the dash of a vehicle, airplane, or motorboat.

The repair person must carry and hold at least three separate tools in order to properly carry out his or her work in each of these applications. Many times the use of separate tools is both inefficient and inconvenient.

A single tool which would perform all the above functions would have great utility as it would:

(a) eliminate the need to carry a number of separate tools; and
(b) make it easier to hold the tools while performing the task.

3. Description of Related Art

A search was made through the existing U.S. Patent literature looking for a self-contained, portable, compound tool which has these four functions:

(a) a flashlight;
(b) a screwdriver;
(c) a light to illuminate the screwdriver's work; and
(d) a circuit continuity tester.

Here are the results of this search.

U.S. Pat. No. 4,768,137 issued Aug. 30, 1988 to Hwaw et al.: This patent shows a screwdriver combined with an illuminating function. The illuminating function does not illuminate the screwdriver's work but provides a halo around the end of the handle of the screwdriver. The screwdriver does not contain a flashlight nor does it contain a continuity tester.

U.S. Pat. No. 4,250,446 issued Feb. 10, 1981 to Ponte: This patent shows a flashlight combined with a circuit tester. It does not make provision for attaching or building in a screwdriver nor for illuminating a built-in screwdriver's work.

U.S. Pat. No. 3,873,915 issued Mar. 25, 1975 to Hayes: This patent shows a standard flashlight modified in a manner which allows it to be used as a continuity tester. No provision is made for attaching or building in a screwdriver nor for illuminating a built-in screwdriver's work.

U.S. Pat. No. 3,775,677 issued Nov. 27, 1973 to Garrett et al.: This patent also shows a standard flashlight modified in a manner which allows it to be used as a continuity tester. Again, no provision is made for attaching or building in a screwdriver nor for illuminating a built-in screwdriver's work.

U.S. Pat. No. 3,753,090 issued Aug. 14, 1973 to Tomek: This patent also shows a standard flashlight modified in a manner which allows it to be used as a continuity tester. Again, no provision is made for attaching or building-in a screwdriver nor for illuminating a built-in screwdriver's work.

All these patents taken together fail to provide the combined functions of:

(a) a flashlight;
(b) a screwdriver;
(c) a light to illuminate the screwdriver's work; and
(d) a circuit continuity tester.

SUMMARY OF THE INVENTION

This invention consists of a hollow cylinderical case which can easily be grasped in one hand and contains a portable electrical power supply.

A screwdriver and an illuminating bulb are attached to one end of the case, and a flashlight is attached to the other end.

OBJECTIVES OF THIS INVENTION

The objectives of this invention are:

(a) to provide a single tool which would eliminate the need to carry a number of separate tools to perform common trouble-shooting tasks;
(b) to make it easier to hold the tools required to perform common trouble-shooting tasks;
(c) to provide a single compound tool which will replace a flashlight, a screwdriver, a light to illuminate the work, and an electrical continuity tester;
(d) to provide a single compound tool which will replace a combination of compound-function and single-function tools which will replace a flashlight, a screwdriver, a light to illuminate the work, and an electrical continunity tester.

DETAILED DESCRIPTION OF THE INVENTION

Description of the Drawings

FIG. 7 is an isometric drawing of the second embodiment of the invention as seen from the screwdriver end.

FIG. 8 is an isometric drawing of the second embodiment of the invention as seen from the flashlight end.

FIG. 13 is an exploded isometric drawing of the electrical connections at the flashlight bulb and reflector for the second embodiment.

FIG. 14 is an exploded isometric drawing of the switch of the second embodiment.

DESCRIPTION OF THE DEVICE

FIGS. 1 through 6 show the first embodiment of the device which is designed to be added to an existing flashlight.

Figure 1:
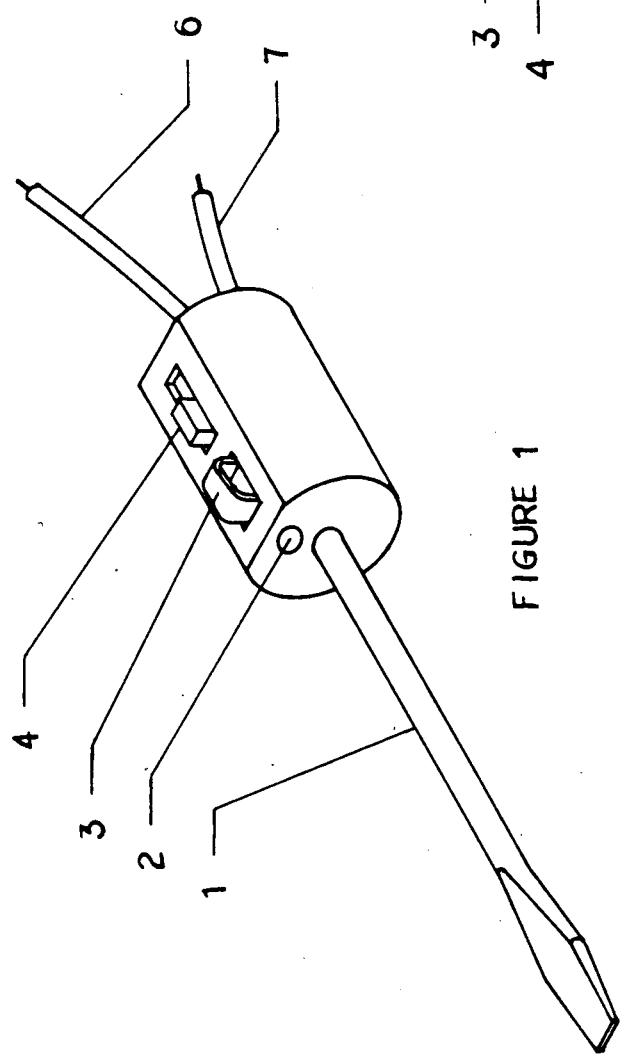
FIG. 1 is an isometric drawing of the first embodiment of the invention as seen from the screwdriver end with the flashlight-section removed.

Referring to FIG. 1, the screwdriver (1) is shown at the left of the drawing. A lightbulb (2) which illuminates the screwdriver is shown near the center along with a contact strip (3) and an off/on switch (4).

Figure 2:
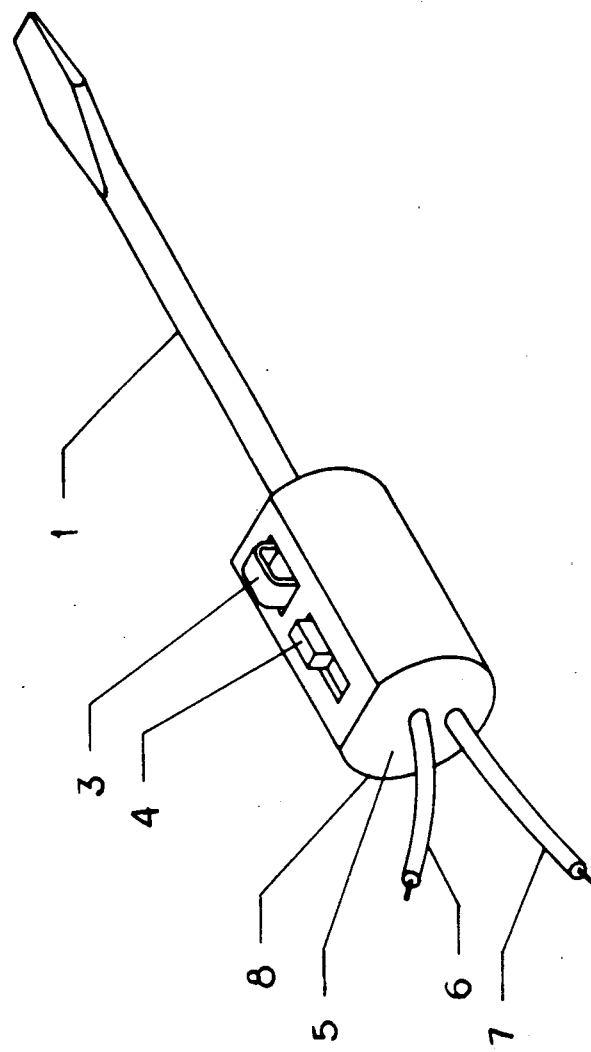
FIG. 2 is an isometric drawing of the first embodiment of the invention as seen from the flashlight end with the flashlight-section removed.

In FIG. 2, the flashlight end (5) is shown along with an electrical wire (6) which connects to the positive terminal of the flashlight battery and an electrical wire (7) which connects to the negative terminal of the battery. The flashlight end (5) fastens to the base of the existing flashlight using conventional fastening means such as adhesives or mechanical fasteners at the parting line (8).

Figure 3:
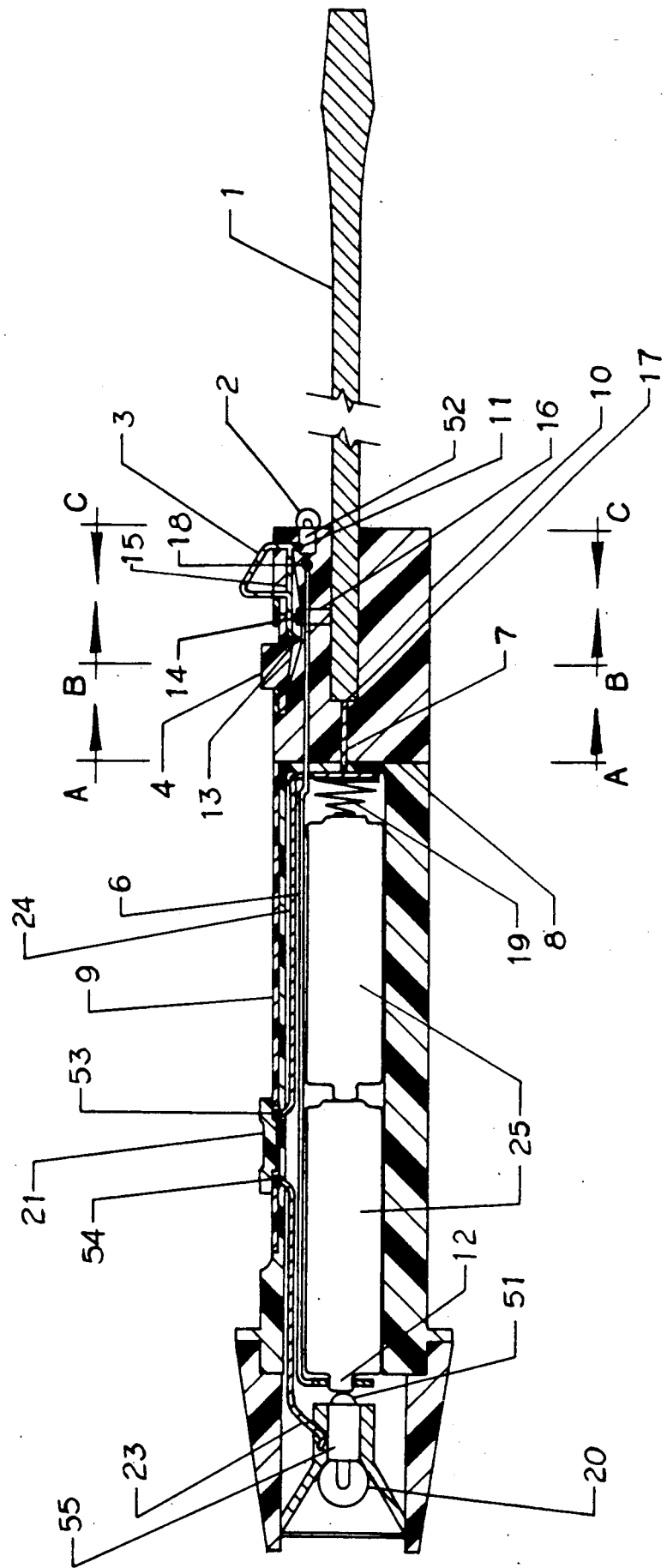
FIG. 3 is a longitudinal cross section of the first embodiment of the invention taken at the center line of the tool.

FIG. 3 is a longitudinal section of the complete tool including the existing flashlight (9) taken along the centerline of the tool so as to expose the inner workings of the invention.

Starting at the right hand side of the drawing, the screwdriver (1) is molded into an electrically nonconductive body (10). Typically, hard rubber or plastic is used for the body.

A lamp receptacle (11) to which a contact strip (3) has been electrically fastened is also molded into the body (10), as is an off/on switch (4). An illuminating lamp (2) is detachably mounted in the receptacle (11). The center electrical contact (18) of the lamp electrically engages an insulated wire (6) which runs to the positive terminal (12) of the battery (25) and is electrically connected to it. The side contact (52) of the lamp is electrically in contact with the receptacle (11).

A wire (15) electrically connects the contact strip to one terminal (13) of the switch. A second wire (16) electrically connects the second terminal of the switch (14) to the end of the metal screwdriver (17), and a third wire (7) electrically connects the end of the metal screwdriver, the wire from the switch terminal identified as (13), and the negative terminal of the battery pack (19).

Figure 6:
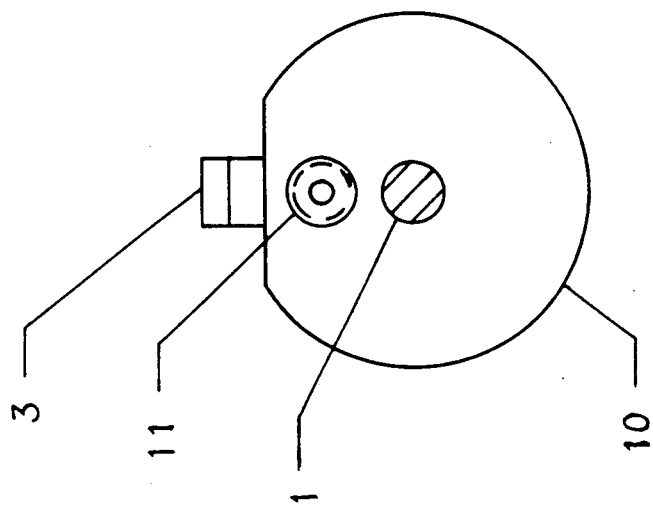
FIG. 6 is a cross section of the first embodiment of the invention taken at section line c—c.
Figure 5:
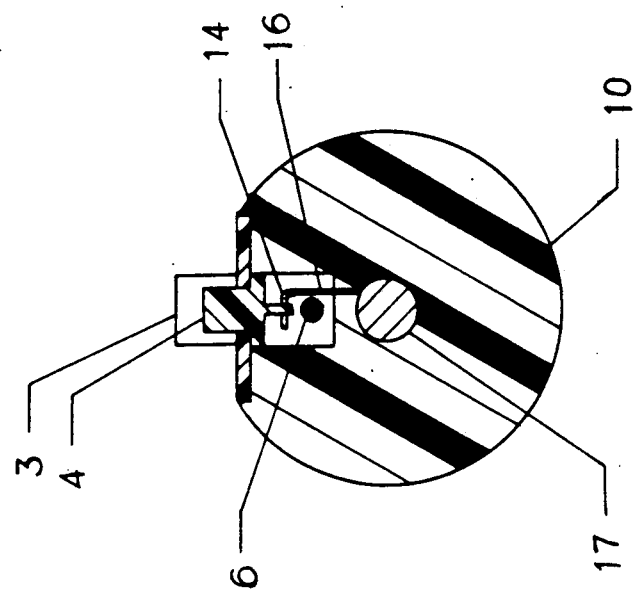
FIG. 5 is a cross section of the first embodiment of the invention taken at section line b—b.
Figure 4:
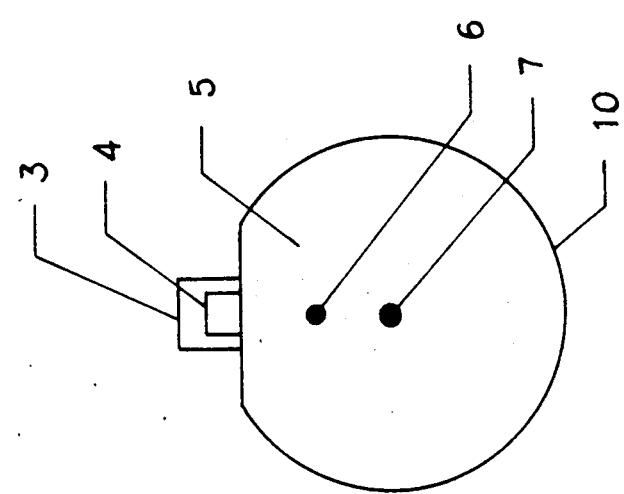
FIG. 4 is a cross section of the first embodiment of the invention taken at section line a—a.

Many of the previously mentioned parts are also shown in FIGS. 4 through 6. FIG. 4 shows the flashlight end (5) which fastens to the base of the existing flashlight using conventional fastening means such as adhesives or mechanical fasteners.

FIG. 5 is a cross section taken at the switch location which shows the relative locations of the wires while FIG. 6 shows the screwdriver end of the body and the location of the lamp receptacle (11).

Figure 15:
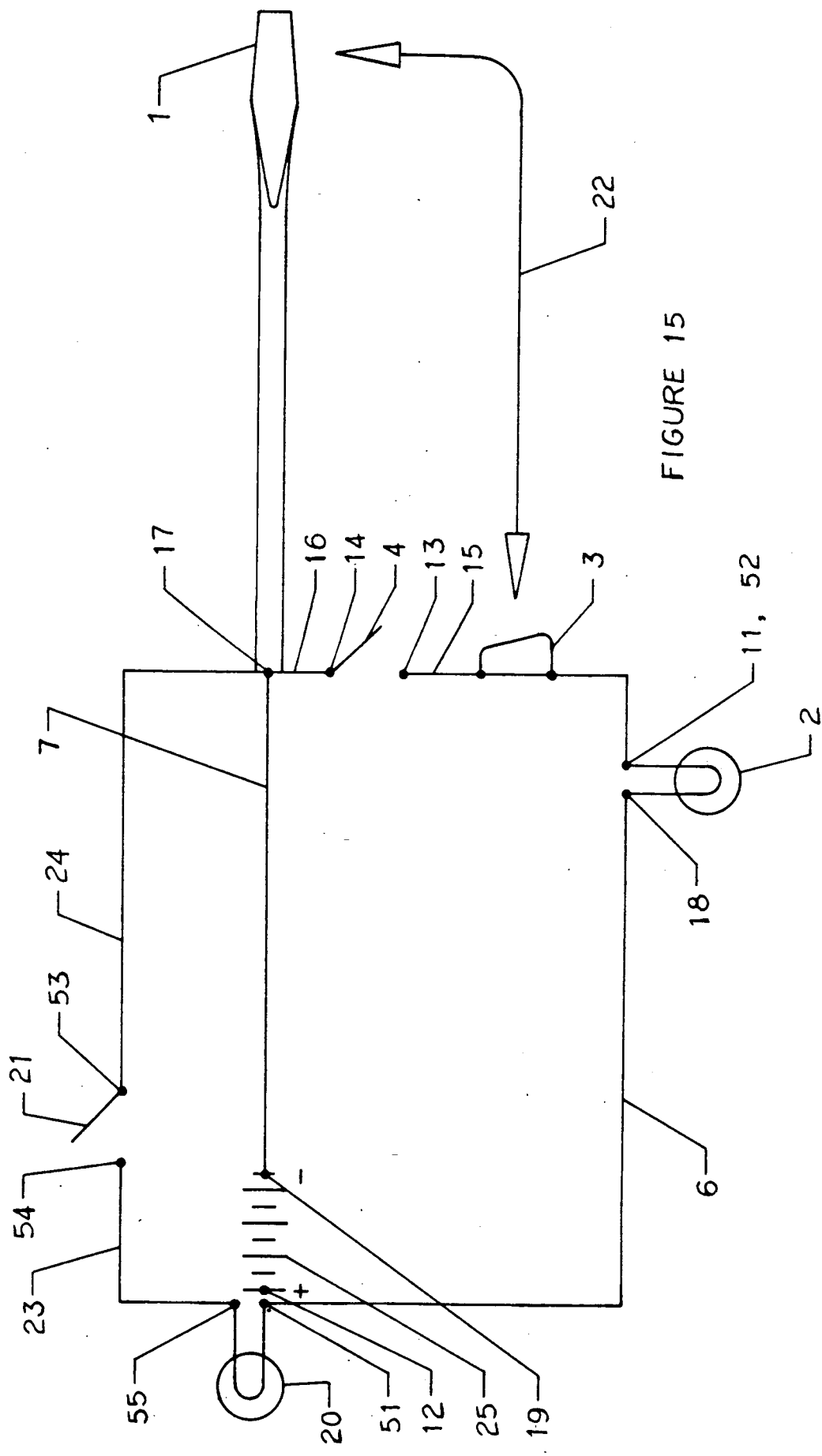
FIG. 15 is a schematic drawing of the electrical circuit in the first embodiment.

FIG. 15 shows the electrical circuit for the first embodiment. Refer to this figure and FIG. 3 to understand the circuit.

Here is a description of the electrical circuit for the screwdriver illuminating lamp:

Starting from the positive end (12) of the battery pack (25), a wire (6) runs along the inside body of the flashlight to the screwdriver lamp receptacle where it contacts the center terminal (18) of the screwdriver-illuminating lamp (2).

The outer case of the lamp receptacle (11) is electrically connected to the contact strip (3) and to one terminal (13) of the off/on switch (4) through a wire (15). The other terminal (14) of the switch (14) is connected to the end of the screwdriver shaft (17) through a wire (16). Another wire (7) connects these tow points (14, 17) to the negative terminal of the battery (19).

The lamp (2) may be lit either by closing the switch (4) or by fastening an electrical conductor, such as a wire (22) between the contact strip (3) and the screwdriver blade (1).

Here is a description of the electrical circuit for the flashlight lamp (20):

Starting at the positive terminal (12) of the battery (25): the center terminal (51) of the flashlight lamp (20) contacts the positive terminal of the battery (12). An electrical conductor (23) is in contact with the side contact (55) of the lamp and runs to one terminal (54) on the flashlight switch ((21) while the other terminal (53) of the switch (21) is in contact with the negative terminal (19) of the battery through a second electrical conductor (24).

The flashlight lamp is illuminated by closing the flashlight switch (21).

FIGS. 7 through 14 show a second embodiment of the device.

In FIG. 7, the screwdriver end (26) is shown at the lower left while the flashlight end (31) is shown at the upper right. The flashlight end (31) screws off so the batteries (37) and the flashlight lamp (40) may be replaced.

The screwdriver illuminating bulb (27) is located where it will illuminate the tip of the screwdriver. A contact strip (28) and a three-position switch (29) for both the screwdriver-illuminating lamp (27) and the flashlight lamp (40) are also shown.

In FIG. 8, the screwdriver end (26) is shown at the upper right while the flashlight end (31) is shown at the lower left. Note the transparent flashlight lens (32) at the flashlight end.

Figure 9:
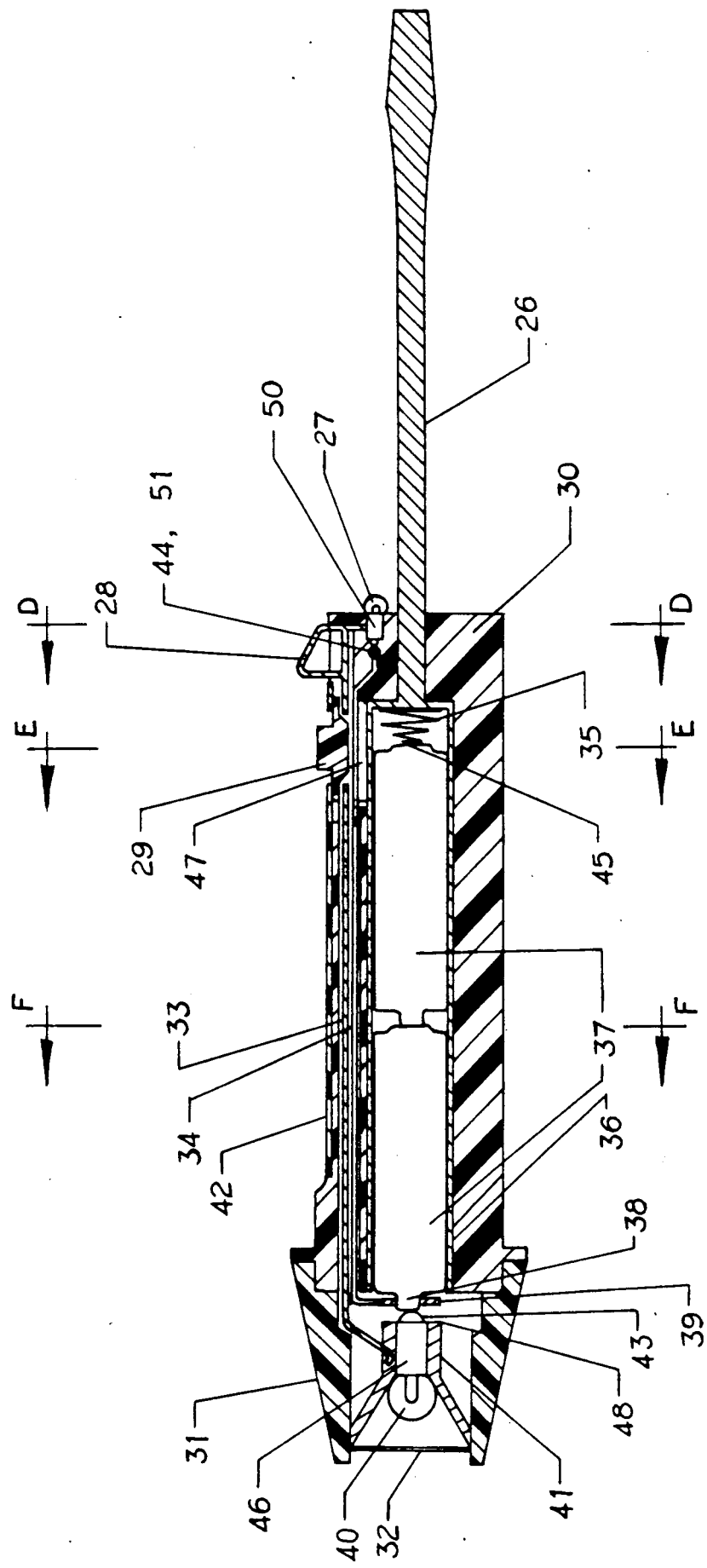
FIG. 9 is a longitudinal cross section of the second embodiment of the invention taken at the center line of the tool.

FIG. 9 shows a longitudinal section taken along the center line of the device to display the interior parts. Starting at the right, the screwdriver (26) is fastened to a hollow metal case (36) which holds the battery pack (37). A spring (35) holds the battery pack (37) under compression so that the positive terminal (38) of the battery pack (37) is in electrical contact with the center terminal (43) of the flashlight lamp (40) and the contact ring (39) of the wire (34) leading to the center terminal (44) of the screwdriver-illuminating lamp (27); and so that the negative terminal of the battery pack (45) is in contact with the spring (35). The other end of the spring (35) is in electrical contact with the hollow metal case (36).

The flashlight illuminating lamp (40) is detachably fastened into a lamp receptacle (46) which is fastened to a lamp reflector (41).

Circuit details can be seen best by referring to FIGS. 13 and 14 in conjunction with FIG. 9. A flat metal strip (33) runs from the switch to the flashlight-illuminating lamp (40) where it contacts the side terminal (48) of the lamp. This strip is insulated away from the battery case (36) by the outer portion of the contact ring (39). Moving the switch (29) to the left electrically connects this strip (33) to a set of metal flutes (47) soldered or welded to the side of the battery case.

One end of an insulated electrical wire (34) is connected to the contact ring (39) located at the positive terminal (38) of the battery (37). The ring (39) is shown in two parts in FIG. 13 to emphasize that the inner section is a metal conductor while the surrounding split ring is electrically nonconductive and serves as an insulator between the positive terminal of the battery (38) and the strip (33) leading to the switch (29).

The wire (34) runs down the outside of the battery case (36) between the two flutes (47), and the other end of the wire (34) is electrically connected to the center terminal (44) of the screwdriver-illuminating lamp receptacle (50)

A contact strip (28) is soldered or welded to the side of the lamp receptacle (50). This contact strip (28) extends out over the two flutes (47) but is not normally in contact with them. When the switch (29) is moved to the rightmost position, the contact strip (28) is electrically connected to the flutes (47) and the screwdriver-illuminating lamp (27) is lit. When the switch (29) is moved to the leftmost position, the other contact strip (33) is electrically connected to the two flutes (47) and the flashlight-illuminating lamp (40) is lit. When the switch (29) is in the center position as shown in FIG. 9, both lamps (27, 40) are unlit.

Figure 10:
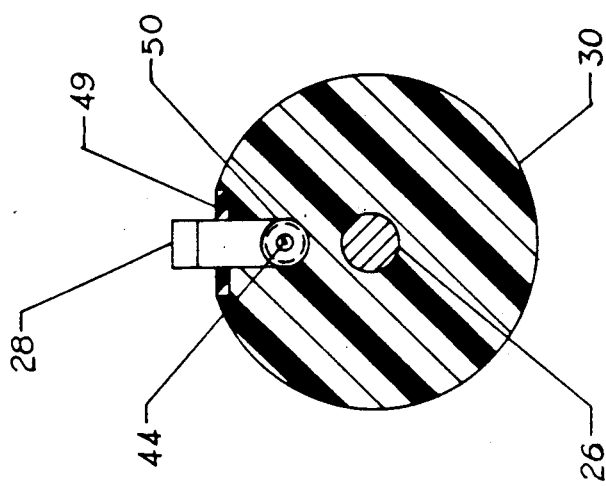
FIG. 10 is a cross section of the second embodiment of the invention taken at section line d—d.

FIG. 10 is a cross section taken at location d—d which shows how the contact strip (28) is fastened to the side of the lamp receptacle. Note the nonconductive cover strip (49) which holds the lamp receptacle in place.

Figure 11:
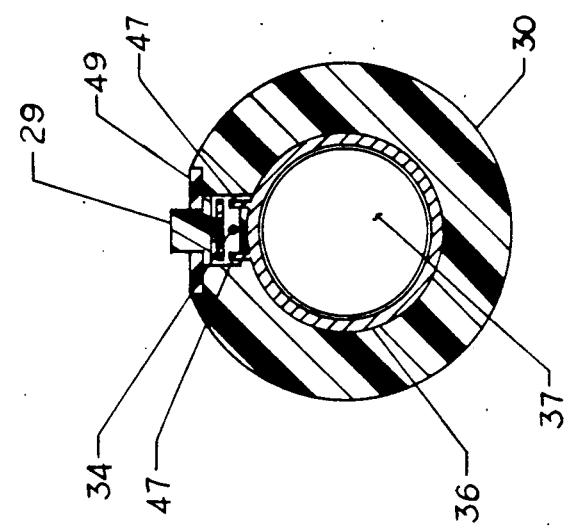
FIG. 11 is a cross section of the second embodiment of the invention taken at section line e—e.

FIG. 11 is a cross section taken at e—e showing the details of how the switch (29) rides on the flutes (47) and is held in place by the cover strip (49). Also note how the insulated wire (34) rides between the flutes (47)

Figure 12:
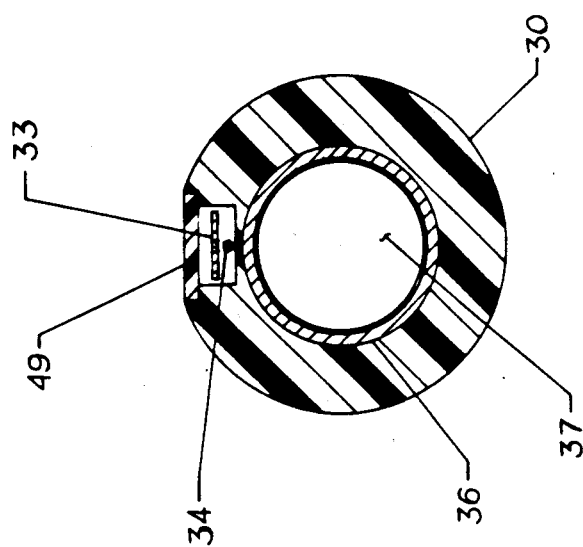
FIG. 12 is a cross section of the second embodiment of the invention taken at section line f—f.

FIG. 12 is a cross section taken at location f—f showing how the contact strip (33) rides in the nonconductive case (30) insulated away from the flutes (47) and the battery case (36). The strip is held in place by the nonconductive cover strip (49).

Figure 16:
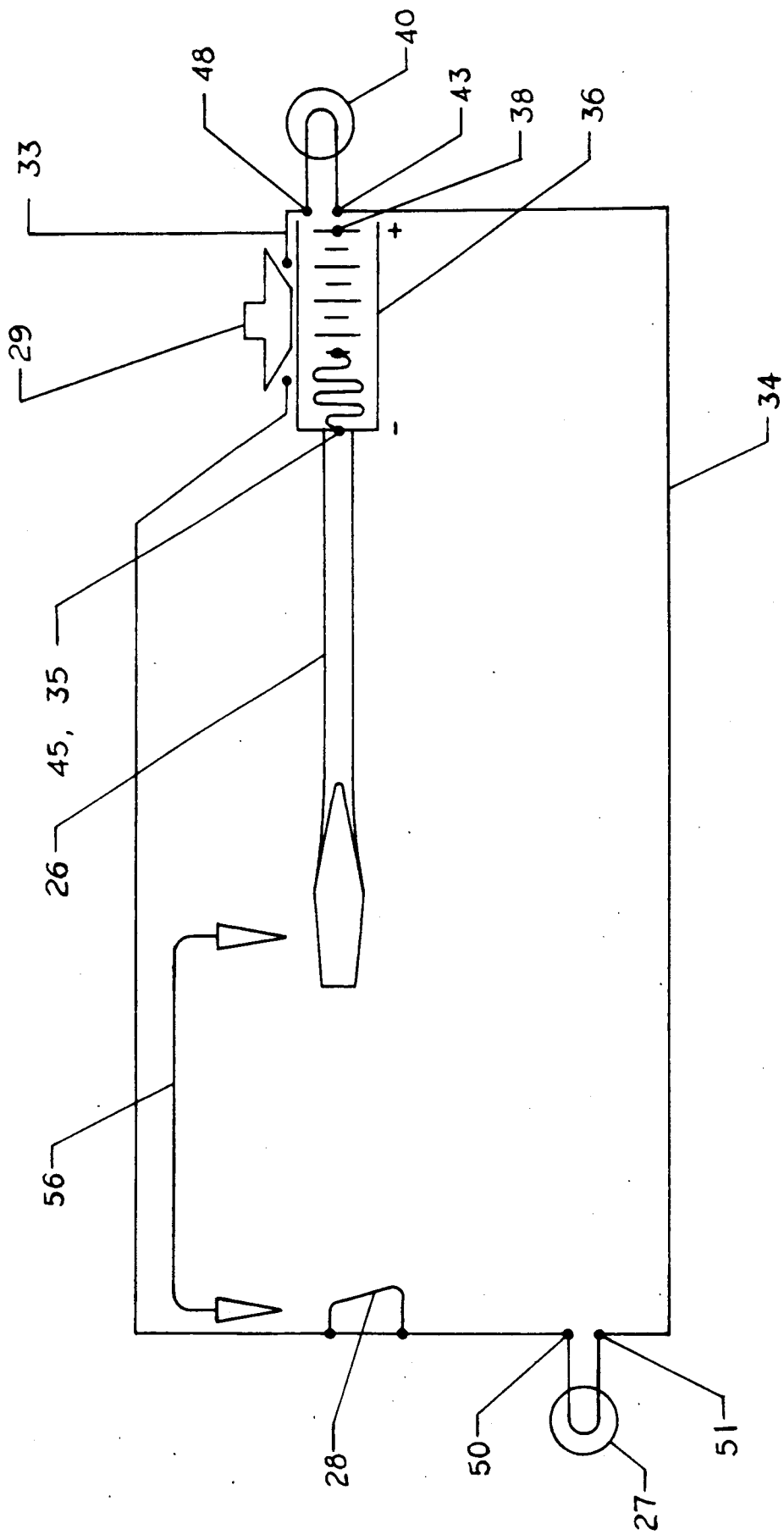
FIG. 16 is a schematic drawing of the electrical circuit in the second embodiment.

FIG. 16 is the electrical circuit of the second embodiment of the device.

Here is a description of the circuit for the flashlight lamp:

The positive terminal of the battery (38) is in electrical contact with the center terminal (43) of the flashlight illuminating lamp (40). The other terminal of the illuminating lamp is in electrical contact with the side terminal of the lamp receptacle (48) which is in contact with the contact strip (33).

The switch (29) has three positions: off, screwdriver-illuminating lamp on, and flashlight lamp on. When the switch (29) in in the center position, neither lamp is lit.

Looking at FIG. 16, when the switch (29) is moved from off to the leftmost position, the contact strip (33) is placed in electrical contact with the battery case (36). The battery case is in contact with the spring (35) which also contacts the negative terminal of the battery (45) thus completing the circuit so that the flashlight lamp (40) is lit.

Here is a description of the circuit for the screwdriver illuminating lamp:

The positive terminal of the battery (38) is electrically connected to the center terminal (51) of the screwdriver-illuminating lamp (27) by the insulated wire (34). The other terminal of the screwdriver-illuminating lamp is in electrical contact with the side of the receptacle (50) which is soldered or welded to the contact strip (28).

Looking at FIG. 16, when the switch (29) is moved from off to the rightmost position, the contact strip (28) is placed in electrical contact with the battery case (36). The battery case is in contact with the spring (35) which also contacts the negative terminal of the battery (45) thus completing the circuit so that the screwdriver-illuminating lamp (27) is lit.

The screwdriver-illuminating lamp (27) may also be lit either by fastening an electrical conductor, such as a wire (56) between the contact strip (28) and the screwdriver blade (26).

Although the above description of the device and the method of its use contains many specificities, these should not be construed as limiting the scope of the invention but as merely as providing illustrations of some of the preferred embodiments of this invention. The scope of the invention should be determined by the appended claims and their legal equivalents, rather than the examples given.

I claim:

1. A compound hand tool suitable for attachment to a flashlight comprising:
   a) a cylinderical block of nonconductive material, shaped and sized so as to be able to be held in one hand by a person, which comprises;
   b) a means of mechanically fastening one end of said cylinderical block to the nonilluminating end of a suitable flashlight;
   c) a metal shaft fastened into said nonconductive material block so said shaft projects from the center of the other end of said cylinderical block at right angles to said cylinder end with the other end of said metal shaft shaped into a useful tool selected from the group consisting of a screwdriver, a nutdriver, an awl, and a socket holder;
   d) an illuminating lamp which illuminates the end of said metal shaft which is shaped into said useful tool;
   e) a conductive strip;
   f) a lamp receptacle to which said illuminating lamp is detachably mounted and to which said conductive strip is permanently affixed so as to be in mechanical and electrical contact with the side of said receptacle and to project outwards from said cylinderical block;
   g) a switch which will turn said illuminating lamp off and on;
   h) a means of electrically connecting the center terminal of said illuminating lamp to one terminal of the power supply in said flashlight;
   i) a means of electrically connecting said contact strip, which is electrically connected to said lamp receptacle which in turn is electrically connected to the side terminal of said illuminating lamp, to one terminal of said switch, and;

j) a means of electrically connecting the other terminal of said switch to said metal shaft and to a second terminal on said power supply;

whereby when said device is attached to a suitable flashlight, said device functions as a flashlight, a useful tool, a light to illuminate the work, and an electrical circuit continuity tester.

2. The device in claim 1 wherein the cylinderical shape of said cylinderical block is modified to provide a flat plane the length of said block and of a suitable width to hold said switch and said contact strip on said flat plane.

3. A compound hand tool comprising:
 a) A cylinderically-shaped, hollow body made of a nonconductive material, shaped and sized so as to be able to be held in one hand by a person, which comprises;
 b) a portable power supply;
 c) an electrically-conductive power supply compression spring;
 d) a metal shaft which has one end shaped into a useful tool selected from the group consisting of a screwdriver, a nutdriver, an awl, or a socket holder;
 e) a cylinderically-shaped hollow metal case, closed at one end and sized and shaped so as to be able to hold said portable power supply, hold said compression spring, and slide into said hollow body with said metal shaft mechanically and electrically fastened to the closed end of said hollow metal case so said metal shaft projects from the center of and at right angles to said hollow metal case end through the end of and at a right angle to the tool-end of said hollow body;
 f) a tool-illuminating lamp which illuminates the end of said metal shaft which is shaped into said useful tool;
 g) a conductive strip;
 h) a tool-illuminating lamp receptacle at said tool end of the device to which said tool-illuminating lamp is detachably mounted and to which said conductive strip is permanently affixed so as to be in mechanical and electrical contact with the side of said receptacle and to project outwards from the side of said hollow body;
 i) a flashlight-illuminating lamp;
 j) a flashlight reflector;
 k) a flashlight-illuminating lamp lens;
 l) a flashlight-illuminating lamp receptacle;
 m) a flashlight-illuminating lamp cover which is detachably mounted to the flashlight-end of said hollow body and contains said flashlight-illuminating lamp, said flashlight reflector, said flashlight-illuminating lamp lens, and said flashlight-illuminating lamp receptacle;
 n) a switch which will independently turn said tool-illuminating lamp and said flashlight-illuminating lamp off and on;
 o) a means of electrically connecting the center terminal of said flashlight-illuminating lamp and the center terminal of said tool-illuminating lamp to one terminal of the power supply in said flashlight;
 p) a means of electrically connecting said contact strip, which is electrically connected to said lamp receptacle which in turn is electrically connected to the side terminal of said tool-illuminating lamp, to one terminal of said switch;
 q) a means of electrically connecting the side of said flashlight-illuminating lamp receptacle, which in turn is electrically connected to the side terminal of said flashlight-illuminating lamp, to a second terminal of said switch;
 r) a means of independently electrically connecting and disconnecting said flashlight-illuminating switch terminal to said hollow metal case which in turn is electrically connected to said compression spring which is electrically connected to the other terminal of said power supply, and;
 s) a means of independently electrically connecting and disconnecting said tool-illuminating switch terminal to said hollow metal case which in turn is electrically connected to said compression spring which is electrically connected to the other terminal of said power supply;

whereby the device functions as a flashlight, a useful tool, a light to illuminate the work, and an electrical circuit continuity tester.

4. The device in claim 3 wherein the cylinderical shape of said cylinderically-shaped hollow body is modified to provide a flat plane of sufficient length and width to hold said switch and said contact strip on said flat plane.

* * * * *